United States Patent
Ohta et al.

(10) Patent No.: US 6,544,884 B2
(45) Date of Patent: Apr. 8, 2003

(54) SEMICONDUCTOR DEVICE AND METHOD OF FABRICATING SAME

(75) Inventors: Hiroyuki Ohta, Tsuchiura (JP); Hideo Miury, Koshigaya (JP); Kazushige Sato, Oume (JP); Takeshi Kimura, Higashimurayama (JP); Hiyoo Masuda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/022,525

(22) Filed: Dec. 20, 2001

(65) Prior Publication Data

US 2002/0043724 A1 Apr. 18, 2002

Related U.S. Application Data

(62) Division of application No. 09/151,590, filed on Sep. 11, 1998, now Pat. No. 6,337,517.

(30) Foreign Application Priority Data

Sep. 19, 1997 (JP) ............................................. 9-254688

(51) Int. Cl.⁷ ........................................... H01L 21/4763
(52) U.S. Cl. ....................... 438/629; 438/631; 438/637
(58) Field of Search ................................ 438/637, 631, 438/629, 626, 624, 633, 612, 692, 632, 118, 622, 621; 257/758, 756, 700

(56) References Cited

U.S. PATENT DOCUMENTS 4,924,295 A * 5/1990 Kuecher ..................... 257/758
4,944,836 A * 7/1990 Beyer et al. ................ 438/633
5,149,674 A * 9/1992 Freeman et al. ............ 438/612
5,331,204 A * 7/1994 Kuroda et al. .............. 257/758
5,404,046 A * 4/1995 Matsumoto et al. ........ 257/750
5,666,007 A * 9/1997 Chung ........................ 257/751
5,847,466 A * 12/1998 Ito et al. ..................... 257/775
5,877,498 A * 3/1999 Sugimoto et al. .......... 250/310
5,986,339 A * 11/1999 Pai et al. .................... 257/700
6,043,158 A * 3/2000 Miyamoto .................. 438/692
6,100,573 A * 8/2000 Lu et al. ..................... 257/508
6,100,589 A * 8/2000 Tanaka ....................... 257/758
6,239,025 B1 * 5/2001 Bease et al. ................ 438/637
6,297,563 B1 * 10/2001 Yamaha ...................... 257/781
6,337,517 B1 * 1/2002 Ohta et al. .................. 257/758
6,403,467 B1 * 6/2002 Akiyama .................... 438/629
6,455,943 B1 * 9/2002 Sheu et al. ................. 257/786
6,465,337 B1 * 10/2002 Lee et al. ................... 438/612

FOREIGN PATENT DOCUMENTS

JP          4-291763         10/1992

* cited by examiner

Primary Examiner—Carl Whitehead, Jr.
Assistant Examiner—Laura Schillinger
(74) Attorney, Agent, or Firm—Antonelli, Terry, Stout & Kraus, LLP

(57) ABSTRACT

A semiconductor device capable of operating at a high speed or of having many functions. In this device, delamination of buried electrodes is prevented and thus high reliability is offered. The depth A of contact holes, the minimum linewidth R of a lower metallization layer, and the thickness B of the lower metallization layer satisfy relations given by $(0.605/R)^{0.5} < A < 2.78 - 1.02B + 0.172B^2$.

3 Claims, 8 Drawing Sheets

WHERE CMP IS NOT USED

WHERE CMP IS USED

SEMICONDUCTOR DEVICE AND METHOD OF FABRICATING SAME

This is a divisional of parent application Ser. No. 09/151,590, filed Sep. 11, 1998, now U.S. Pat. No. 6,337,517, the entire disclosure of which is hereby incorporated by reference.

BACKGROUND OF THE INVENTION

The present invention relates to a semiconductor integrated circuit device and a method of fabrication thereof, and the invention relates more particularly to a semiconductor integrated circuit device having multilevel metallization and a method of fabricating such a device.

The structure of a known semiconductor device is shown in FIG. 2. As can be seen from this figure, in the known semiconductor device, an isolation film 10, a gate oxide film 11 and gate electrodes 3 are formed on the silicon substrate 2. A lower metallization layer 5 is formed over the laminate via an interlayer dielectric film 4. An upper metallization layer 7 is formed over the lower metallization layer 5 via an interlayer dielectric film 6. The upper metallization layer 7 and the lower metallization layer 5 are electrically connected by electrodes 9 buried in contact holes 8. This semiconductor device is fabricated in a manner described below.

To electrically isolate individual transistors, the silicon substrate is first thermally oxidized locally to form the isolation film 10. Then, the gate oxide film 11 is formed by thermal oxidation in regions where transistors should be formed. The gate electrodes 3 are formed on the gate oxide film by a CVD process step and then by a photolithography step. Ions are implanted into the silicon substrate 2 to form a pn junction. Thus, an ion-implanted layer is formed. Thereafter, the interlayer dielectric film 4 is formed over the gate electrodes 3 by CVD. To make the surface of the interlayer dielectric film 4 as flat as possible, the interlayer dielectric film 4 is caused to reflow by annealing, or the interlayer dielectric film is deposited as a thick layer and is etched back.

The lower metallization layer 5 is formed on top of the interlayer dielectric film 4 by sputtering and then by photolithography. The interlayer dielectric film 6 and the upper metallization layer 7 are formed on the lower metallization layer 5 similar, to the lower metallization layer 5. The contact holes 8 are formed by local etching to electrically connect the upper metallization layer 7 and the lower metallization layer 5. The buried electrodes 9 are formed inside the contact holes 8. These techniques are described, for example, in Japanese Patent Laid-Open No. 291763/1992.

Semiconductor devices tend to be packaged with an increasingly larger device density year after year. Concomitantly, it is necessary to increase the depth of the contact holes 8. In particular, if the semiconductor device 1 has a minimum linewidth of less than 0.5 $\mu$m, a delay in the conductor lines is a rate limiter which impedes improvement of the operating speed of the semiconductor device 1. To prevent this, the capacitance between the two metallization layers is reduced. For this purpose, the thickness of the interlayer dielectric film is increased. That is, it is necessary to increase the depth of the contact holes 8. With this trend, it is necessary to increase the depth of the contact holes 8 in devices having minimum linewidths of less than 0.5 $\mu$m, typified by a 256-megabit DRAM, to accomplish higher speeds.

Where more or higher functions are to be imparted to the semiconductor device, the contact holes 8 need to be deeper, which is also the case where higher operating speeds are necessary. For example, an existing computer has been fabricated by mounting both a semiconductor chip having a single function such as a CPU and semiconductor chips acting as memories on a printed-circuit board. In recent years, however, attempts have been made to obtain improved efficiencies or more functions by fabricating a CPU and memories on one chip. This has demanded that the depth of the contact holes 8 be increased. As an example, a combination of a dynamic memory and a logic circuit such as a CPU will be considered. Tall capacitors exist on top of gate electrodes of a dynamic memory. Therefore, the metal interconnection lines are at a higher level than in the logic circuit. The logic circuit needs more metallization layers than memories and so the top metallization layer of the logic circuit must pass over the capacitors. Therefore, the contact holes 8 permitting either connection of these different metallization layers or connection of the top metallization layer and the semiconductor substrate need to be deeper than conventional.

Using a known technique, if the interlayer dielectric film is made thicker, the irregularities on the surface increase. Furthermore, when a metallization layer is patterned photolithographically, defocusing takes place. For these and other reasons, limitations are imposed on the depth of the contact holes 8.

In recent years, chemical-mechanical polishing (CMP) has permitted perfect planarization. Consequently, no limitations are placed on steps that can be planarized. Hence, application of contact holes 8 which are so deep that they have not been heretofore employed from a point of view of manufacturing yield are now being discussed.

It is considered that this technique is advantageous where a dynamic memory and a logic circuit such as a CPU are both mounted on one chip. In particular, the dynamic memory has tall capacitors on top of gate electrodes and so metallization layers exist at higher positions than the logic circuit. Therefore, in order to connect the memory and the logic circuit within one chip, it is necessary to perform a planarization step so that the interlayer dielectric films 4 and 6 in the logic circuit are thick and that the interlayer dielectric films 4 and 6 in the memory are thin. To planarize steps that are unprecedentedly large, adoption of chemical-mechanical polishing (CMP) is being discussed.

Chemical-mechanical polishing (CMP) is designed to mechanically polish interlayer dielectric films to flatten them. Therefore, it is possible to obtain interlayer dielectric films 4 and 6 having surfaces parallel to the surface of the silicon substrate surface without the sagging experienced in the known etching technique. Especially, in a multifunctional semiconductor device in which a CPU is combined with memories, deep contact holes formed by CMP are considered unavoidable.

However, our research has revealed that simply deepening the contact holes 8 to seek higher functions or higher operating speeds does not result in fabrication of the semiconductor 1 with high reliability. Specifically, if the contact holes 8 are simply deepened without taking account the dimensions at various locations, the electrodes 9 buried in the contact holes 8 peel at the locations of the contact holes 8 at which stress is concentrated. Consequently, electrical connections with a high degree of probability are not feasible.

Furthermore, we have discovered that planarization achieved by CMP increases the possibility of delamination of the buried electrodes. In particular, CMP completely flattens the whole surface of the semiconductor device chip. This increases the stress. In the known technique, different layers are slightly uneven as shown in FIG. 2 and so the stress is distributed (FIG. 4a). The stress concentrated in the corners of the contact holes 8 is mitigated. However, CMP achieves complete planarization, resulting in concentration of the stress in the corners of the contact holes 8. Hence, delamination is likely to occur.

SUMMARY OF THE INVENTION

It is an object of the present invention to provide a reliable semiconductor device which operates at a high speed or has many functions and in which delamination of buried electrodes is prevented.

We have made an intensive investigation to achieve the above-described object and have discovered the mechanism for delamination of a buried electrode. This mechanism is described below with reference to FIGS. 3–8.

The buried electrodes delaminate during the processing step for forming a film for creating the buried electrodes 9 shown in FIG. 3. Thermal stress acting on the buried electrodes is concentrated in the corners of the contact holes. The buried electrodes 9 begin to delaminate from the lower metallization layer 5. In particular, the interlayer dielectric film is made of a material having a small coefficient of thermal expansion such as a silicon oxide film. On the other hand, the buried electrodes 9 are made of a material having a large coefficient of thermal expansion such as aluminum or tungsten. Therefore, if the temperature is lowered after formation of a film creating the buried electrodes 9 at a high temperature, the buried electrodes 9 undergo a large tensile stress acting vertically upward. Since the lower metallization layer 5 is made of a material having a large coefficient of thermal expansion such as aluminum or copper, shrinkage occurs in the direction of the film thickness during a temperature drop. As a result, the buried electrodes 9 are pulled vertically. Due to these two actions, a large tensile stress acts on the buried electrodes 9. Stress is concentrated in the corners. If the stress exceeds the limit stress for delamination, then delamination does take place. Especially, where planarization is performed by CMP, stress dispersion does not take place as shown in FIG. 4b. Rather, the stress is concentrated at one point. This increases the stress at the corners further. Since the delamination occurs when the stress in the thin film exceeds the limit stress, the delamination can be prevented by holding the stress in the thin film below the limit stress.

Taking account of the above-described mechanism for producing delamination, we have analyzed the sensitivity and have found that the stress in the buried electrodes 9 causing the delamination is affected greatly by two dimensional parameters, i.e., the depth of the contact holes 8 and the thickness of the lower metallization layer 5. Since the thermal stress is a function of the lengths of the two materials, a larger tensile stress is produced if the contact holes are deeper and the lower metallization layer 5 is thicker with the structure shown in FIG. 3. Therefore, delamination of the buried electrodes 9 can be prevented even if the contact holes are deep by optimizing the dimensional parameters other than the contact hole depth.

FIG. 5 shows an example of stress analysis by a finite element method, using these two dimensional parameters. Values of stress at the corners of the contact holes normalized with the strength of the limit stress for delamination are shown in this figure, as well as the presence or absence of delamination occurring in experiments. It can be seen from these results that with the known device, stress is small, because the contact holes are not required to be deep. Hence, delamination heretofore has presented no problems. However, where portions having different heights such as memories and a logic portion are formed on one chip of a semiconductor device, the contact holes 8 are made deep. Also, where high-density devices are fabricated, using design rules of less than 0.5 $\mu$m, to cope with higher operating speeds, the contact holes 8 are rendered deeper. In these cases, the dependence of the delamination on the thickness of the lower metallization layer 5, i.e., the delaminated region, becomes conspicuous. That is, it is obvious that the thickness of the lower metallization layer 5 needs to be limited for high-speed devices having such high device density or many functions.

The tensile stress also depends much on the density of the contact holes. FIG. 6 shows the relation of stress normalized with the limit strength for delamination to the contact hole spacing. The contact hole spacing is the distance between the closest contact holes as shown in FIG. 7. As shown in FIG. 8, conducting lines connected with the closest contact hole may terminate in the vicinities of the contact hole.

Where the contact hole spacing is 0.5 $\mu$m, i.e., the contact holes are present at a high density, the stress is distributed among the contact holes and thus is small as shown in FIG. 6.

Where the contact holes are more sparsely distributed, the stress increases. Where the contact hole spacing is 10 $\mu$m, the stress becomes almost saturated. That is, in order to prevent delamination in the semiconductor device 1, it is necessary to limit the thickness of the lower metallization layer 5 such that the stress at the corners of the contact holes is less than the limit intensity for delamination where the contact hole spacing is more than 10 $\mu$m.

The present invention provides a semiconductor device comprising: a semiconductor substrate having a main surface; plural layers of metallization stacked on the main surface of the semiconductor substrate via a dielectric film; and conductive interconnects formed by said layers of metallization; and contact holes for electrically connecting desired ones of the conductive interconnects of the different layers of metallization. The layers of metallization include a lower metallization layer closer to the substrate. The lower metallization layer contains aluminum atoms. The interconnects of the lower metallization layer have a minimum linewidth R of less than 0.25 $\mu$m. Conductive materials including tungsten atoms are present inside the contact holes. The depth A of the contact holes, the minimum linewidth R of the conductive interconnects of the lower metallization layer, and the thickness B of the lower metallization layer satisfy the relations given by

[Eq. 5]

$$(0.605/R)^{0.5} < A < 2.78 - 1.02B + 0.172B^2$$

In this structure, if tungsten atoms are contained in the conductive materials inside the contact holes, the conductive materials inside the contact holes are prevented from delamination from the conductive interconnects. Therefore, breaks in the conductive interconnects or shorts are less likely to occur. Hence, a reliable semiconductor device can be obtained.

If aluminum atoms are contained in the conductive materials inside the contact holes, the depth A of the contact holes, the minimum linewidth R of the interconnects of the lower metallization layer, and the thickness B of the lower metallization layer should satisfy the relations given by

[Eq. 6]

$$(0.605/R)^{0.5} < A < 3.84 - 2.14B + 0.25B^2$$

If the surface of the dielectric film in contact with the bottom surface of the upper metallization layer is planarized by CMP, or if the spacing between the adjacent contact holes is more than 10 µm, the conductive materials inside the contact holes are likely to delaminate from the conductive interconnects. In accordance with the present invention, the conductive materials can be prevented from delamination from the interconnects. Hence, a reliable semiconductor device can be derived.

Where a semiconductor device comprises a semiconductor substrate having memories and a logic circuit packed on one main surface of the substrate, thus requiring deep contact holes, the present invention can prevent the conductive materials from delamination from the conductive interconnects. In consequence, a reliable semiconductor device can be manufactured.

Other objects and features of the invention will appear in the course of the description thereof, which follows.

DESCRIPTION OF THE PREFERRED EMBODIMENTS

Figure 1:
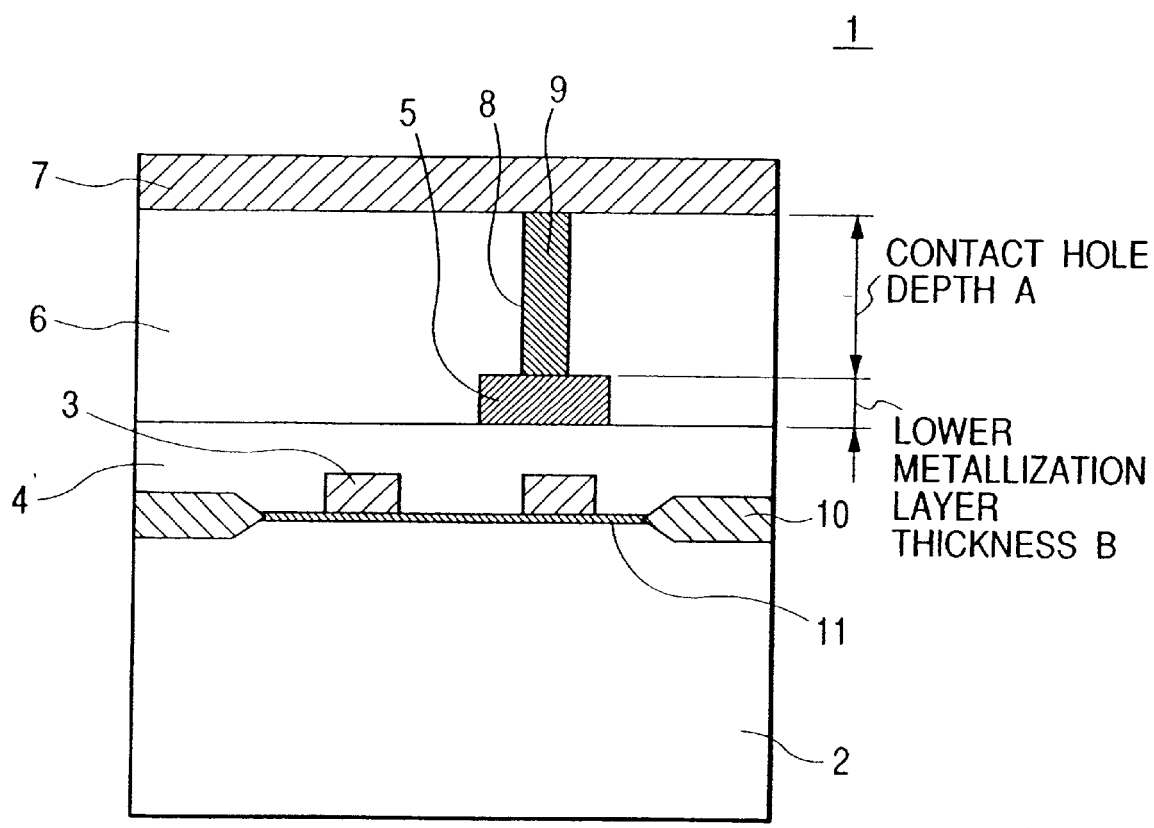
FIG. 1 is a schematic cross-sectional view of main portions of a semiconductor device in accordance with the present invention.
Figure 2:
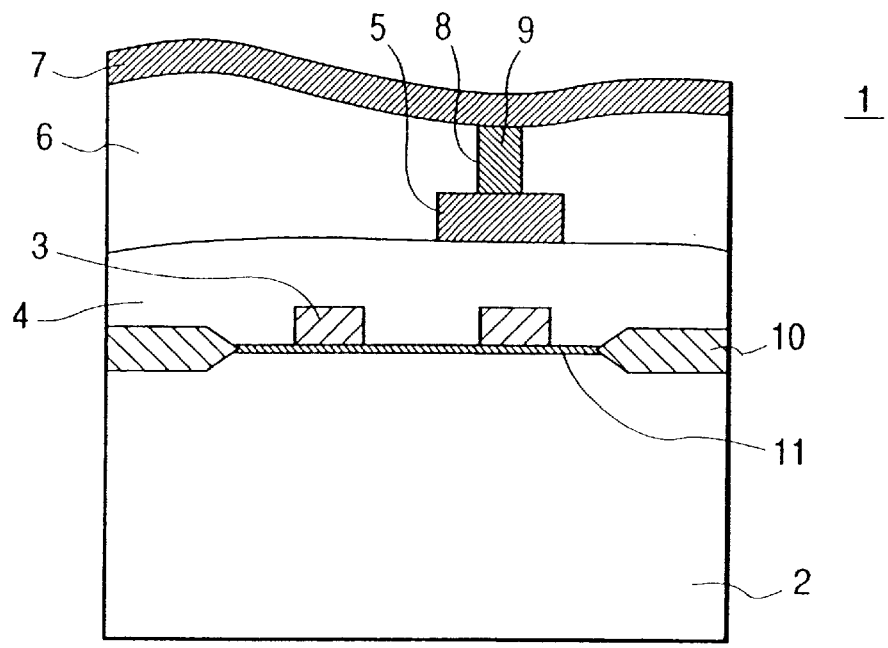
FIG. 2 is a schematic cross-sectional view of a known semiconductor device.
Figure 3:
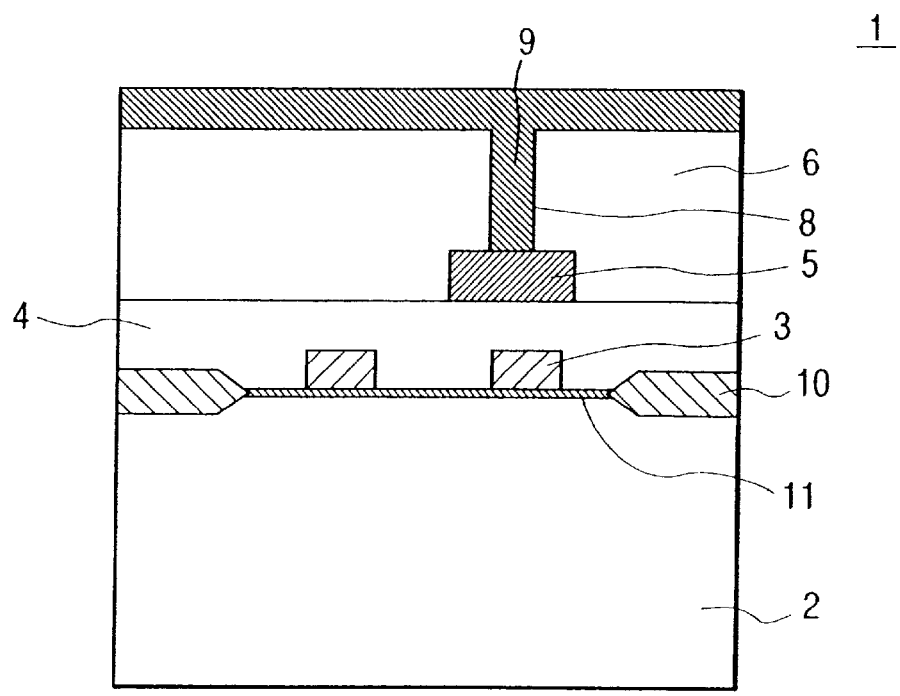
FIG. 3 is a view similar to FIG. 2, but illustrating the result of a process step in which defects are produced.

A semiconductor device in accordance with the present invention is generally indicated by numeral 1 in the cross-sectional view of FIG. 1. The cross-sectional structure of the semiconductor device 1 consists mainly of a silicon substrate 2, gate electrodes 3, an interlayer dielectric film 4, a lower metallization layer 5, an upper metallization layer 7, an interlayer dielectric film 6, contact holes 8 (only one is shown), buried electrodes 9, an isolation film 10, and a gate oxide film 11. The isolation film 10, the gate oxide film 11, and the gate electrodes 3 are stacked on the silicon substrate 2. The lower metallization layer 5 is formed over this stack via the interlayer dielectric film 4. This interlayer dielectric film 4 is made of an insulator including silicon oxide. The lower metallization layer 5 is made of a conductor including silicon oxide. The upper metallization layer 7 is formed over the lower metallization layer 5 via the interlayer dielectric film 6. This interlayer dielectric film 6 is made of an insulator including silicon oxide. The surfaces of the interlayer dielectric films 4 and 6 are planarized by CMP (chemical-mechanical polishing). The upper metallization layer 7 and the lower metallization layer 5 are electrically connected by electrodes 9 buried in the contact holes 8. In this embodiment, the buried electrodes 9 are made of a material including tungsten.

In this structure, the interlayer capacitance must be reduced to prevent delay in the conductive interconnects due to miniaturization. That is, the optimum thickness of the interlayer dielectric film 6 was about 1.1 µm, where the 0.5 µm-design rule (i.e., the minimum linewidth was 0.5 µm) was used. Where the semiconductor device 1 is fabricated on a trial basis using the 0.25 µm-design rule, the delay in the conductive interconnects should not be a rate limiter. For this purpose, the optimum thickness of the interlayer dielectric film 6 is given by

[Eq. 7]

$$(k)^{0.5}$$

where k is a scaling factor. Therefore, the thickness needs to be in excess of 1.5 µm. In other words, the depth A of the contact holes 8 must be 1.5 µm or more, which is greater than the conventional depth of about 1.0 µm. It has been generally considered that where the minimum linewidth is R, the depth A of the contact holes at which the delay in the conductive interconnects is not a rate limiter is given by

[Eq. 8]

$$A = (0.605/R)^{0.5}$$

However, increasing the depth A of the contact holes 8 based on the above-described calculational formula increases the stress in the buried electrodes and produces delamination. Many poor contacts were produced.

In an attempt to solve the foregoing problems, we have conducted a thorough investigation and have found that using the thicknesses of the metallization layers as parameters is important in evaluating the optimum contact hole depth. As a result of stress analysis using a finite element method and experiments, we have successfully determined the values of the depth A of the contact holes and of the thickness B of the lower metallization layer 5.

Stress tends to increase with an increase in the spacing between the contact holes. After the spacing exceeds 10 µm, the spacing becomes almost saturated. The values of A and B are determined such that the stress does not exceed the limit value for delamination where the contact hole spacing is 10 µm. No defects were induced at all where the minimum linewidth R of the lower metallization layer, the depth A (µm) of the contact holes 8, and the thickness B (µm) of the lower metallization layer 5 satisfy the relations

[Eq. 9]

$$(0.605/R)^{0.5} < A < 2.78 - 1.02B + 0.172B^2 \quad (1)$$

Where the buried electrodes 9 are made of a conductor including aluminum, no defects are induced at all if the following relations are met:

[Eq. 10]

$$(0.605/R)^{0.5} < A < 3.84 - 2.14B + 0.25B^2 \qquad (2)$$

The above equations are found by the least squares method from the results of analysis of stress and from experimental results.

Figure 9:
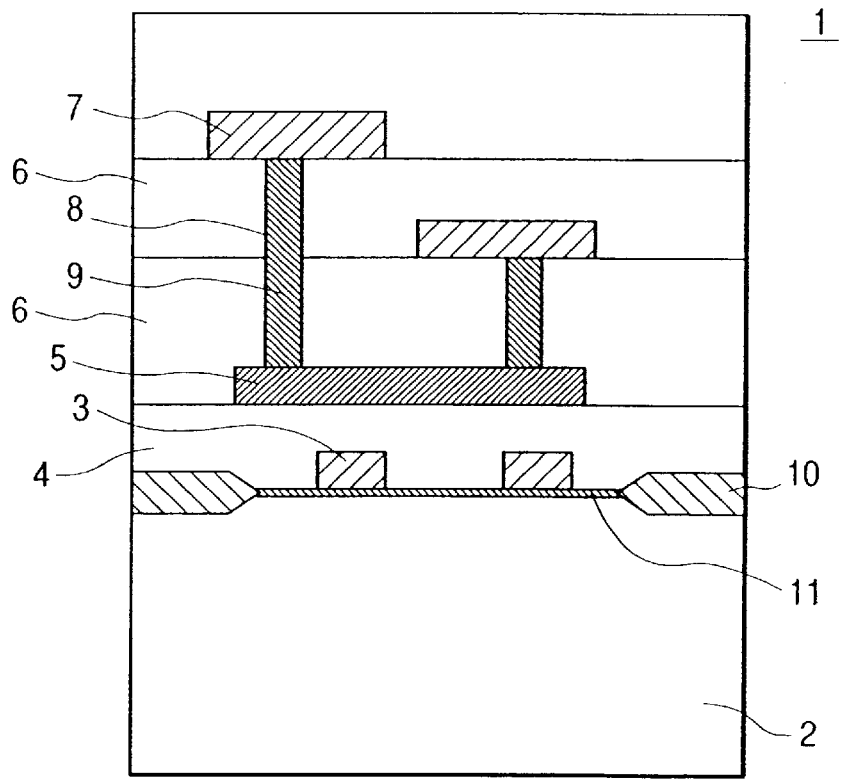
FIG. 9 is a diagram similar to FIG. 1, but showing a more practical structure.

In practice, a multiplicity of buried electrodes are connected with one metallization layer 5, as shown in FIG. 9. In this case, it is necessary that each formula hold for the deepest contact holes. The minimum linewidth R of the conductive interconnects formed by the lower metallization layer is the minimum linewidth in the contact holes because the stress at the contacts is a concern.

The upper metallization layer 7, the lower metallization layer 5, and the buried electrodes 9 may be different kinds of films stacked on top of each other. If the film containing aluminum is thicker than the films containing other materials, then the aluminum-containing film may be regarded as a film consisting totally of aluminum and calculations may be performed using Eq. (1).

The semiconductor device 1 shown in FIG. 1 is manufactured by a method which will now be described. First, a silicon substrate is thermally oxidized locally to electrically isolate individual transistors. Thus, the isolation film 10 is formed. Then, the gate oxide film 11 is formed by thermal oxidation in regions where the transistors should be fabricated. Gate electrodes 3 are formed by CVD and then by photolithography. Ions are implanted to form a pn junction inside the silicon substrate 2. Thus, an ion-implanted layer 12 is formed. The interlayer dielectric film 4 is formed over the gate electrodes 3 by CVD. To make the surface of the interlayer dielectric film 4 as flat as possible, the interlayer dielectric film 4 is caused to reflow by annealing, or the film 4 is deposited as a thick film and etched back. Then, the lower metallization layer 5 is formed on top of the interlayer dielectric film 4 by sputtering and then by photolithography. Another interlayer dielectric film 6 is formed over the lower metallization layer 5. The contact holes 8 are formed by local etching to permit electrical connection of the upper metallization layer 7 (formed later) with the lower metallization layer 5. Buried electrodes 9 are formed in the contact holes 8. The upper metallization layer 7 is formed in contact with the buried electrodes 9.

In the present embodiment, the transmission speed in the conductive interconnects can be increased with device miniaturization while maintaining the reliability of the interconnects. In particular, even if the contact holes are deep, the stress in the buried electrodes 9 is decreased by optimizing the contact hole depth and the thickness of the lower metallization layer. Thus, delamination of the films can be prevented. Therefore, deep contact holes can be formed to realize higher speed in the conductive interconnects. In this way, a high-speed, reliable semiconductor device 1 can be obtained.

Furthermore, in the present embodiment, the upper metallization layer 7 can be accurately formed, because the interlayer dielectric film 6 is flattened. In particular, during photolithographic exposure for forming the upper metallization layer 7, the interlayer dielectric film 6 is planarized. Therefore, the whole inner surface of the semiconductor device 1 is accurately in focus. Hence, the upper metallization layer 7 can be accurately formed.

Consequently, breaks in the conducting lines or shorts are unlikely to occur. Thus, a reliable semiconductor device 1 can be manufactured. Where planarization is performed by CMP, local stress would normally increase. The present invention can suppress such increase in the stress. Therefore, delamination and destruction of the buried electrodes are prevented. Hence, a reliable semiconductor device 1 can be obtained.

Figure 10:
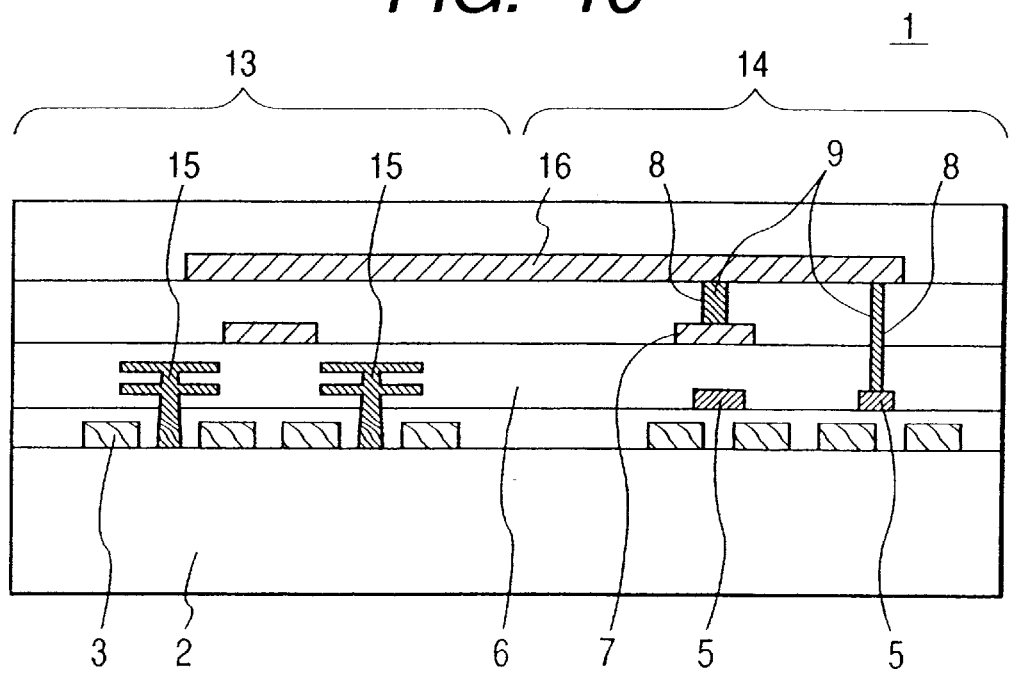
FIG. 10 is a schematic cross-sectional view of another semiconductor device in accordance with the invention.

Referring to FIG. 10, there is shown a second embodiment of the present invention. In the present embodiment, a high-density memory 13 and a high-density logic circuit 14 are contained within one chip of a semiconductor device. Since the memory 13 has capacitors 15, a metallization layer 16 is formed over the capacitors. Because of the refresh characteristics of the memory, a sufficiently large electrostatic capacity must be imparted to each capacitor 15. Therefore, each capacitor 15 needs to be about 1.5 µm tall. In consequence, in the memory, the metallization layer 16 is formed at a location sufficiently remote at least from the surface of the silicon substrate. On the other hand, in the logic circuit 14, no capacitors exist and so the lower metallization layer 5 exists in close proximity to the surface of the silicon substrate. The contact holes 8 and buried electrodes 9 are formed to connect these two metallization layers. The contact holes 8 need to be over 1.5 µm deep.

Since the metallization layer 16 extends across both the memory 13 and the logic circuit 14, the interlayer dielectric film 6 is flattened and is almost parallel to the rear or front surface of the silicon substrate.

The interlayer dielectric film 6 is made of an insulator including silicon oxide. In this structure, the depth A of the contact holes 8 and the thickness B of the lower metallization layer 5 satisfy the relation given by Eq. (1) above.

The process sequence of the present embodiment is as follows. First, the silicon substrate is thermally oxidized locally to electrically isolate individual transistors. Thus, the isolation film 10 is formed. Then, the gate oxide film 11 is formed by thermal oxidation in regions where the transistors should be formed. The gate electrodes 3 are then formed on the gate oxide film by a CVD process step, then by a photolithography step, and by an etching step. Ions are implanted into the silicon substrate 2 to form a pn junction in the silicon substrate 2. Thus, the ion-implanted layer 12 is formed. Thereafter, the interlayer dielectric film 4 is formed over the gate electrodes 3 by CVD. To make the surface of the interlayer dielectric film 4 as flat as possible, the interlayer dielectric film 4 is caused to reflow by annealing, or the interlayer dielectric film is deposited as a thick layer and etched back. The planarization may also be performed by CMP.

Then, the capacitors 15 in the memory 13 are formed by CVD, photolithography, and etching. The lower metallization layer 5 is formed on top of the interlayer dielectric film 4 by sputtering and then by photolithography and etching. The lower metallization layer 5 is made of a conductor including aluminum atoms. The interlayer dielectric film 6 and the upper metallization layer 7 are formed on the, lower metallization layer 5 in the same way as the lower metallization layer 5. The interlayer dielectric film 6 is deposited on the upper metallization layer 7 and polished by CMP to remove the difference in height between the memory 13 and the logic circuit 14. In this way, the memory and the logic circuit are flattened. The interlayer dielectric film 6 is made of an insulator including silicon oxide. The contact holes 8 are formed by local etching to permit electrical connection of a metallization layer 16 (formed later) with the lower metallization layer 5. The buried electrodes 9 are formed inside the contact holes 8. The buried electrodes are made of a conductor including tungsten atoms. The metallization layer 16 is formed over both the memory 13 and the logic circuit 14 by the same technique as used to form the lower metallization layer 5.

In the present embodiment, the interlayer dielectric film 6 is flattened, although the metallization layers differ greatly in height between the memory 13 and the logic circuit 14. Therefore, the metallization layer 16 can be formed accurately. In particular, during photolithographic exposure to define the metallization layer 16, both the memory 13 and the logic circuit 14 are in focus because the interlayer dielectric film 6 has been planarized. Hence, the metallization layer 16 can be formed precisely. Breaks in the conductive interconnects and shorts are unlikely to occur. Thus, a reliable semiconductor device 1 can be manufactured.

In the present embodiment, the effects of delay in the conductive interconnects accompanied by higher device density are prevented by increasing the thickness of the interlayer dielectric film 6. At the same time, the stress can be prevented from increasing. Therefore, destruction of the buried electrodes 9 can be prevented. Consequently, a high-speed, electrically reliable semiconductor device 1 can be manufactured with an increased device density.

Figure 4A:
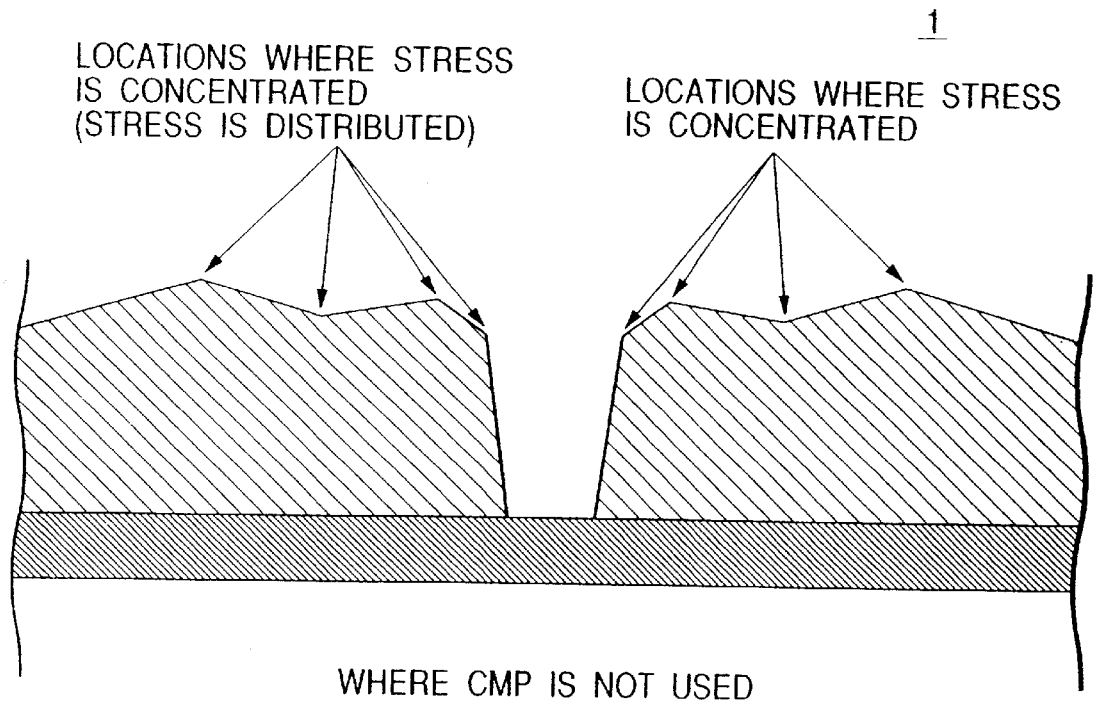
FIGS. 4a and 4b are diagrams illustrating the relation between CMP and stress concentration.
Figure 4B:
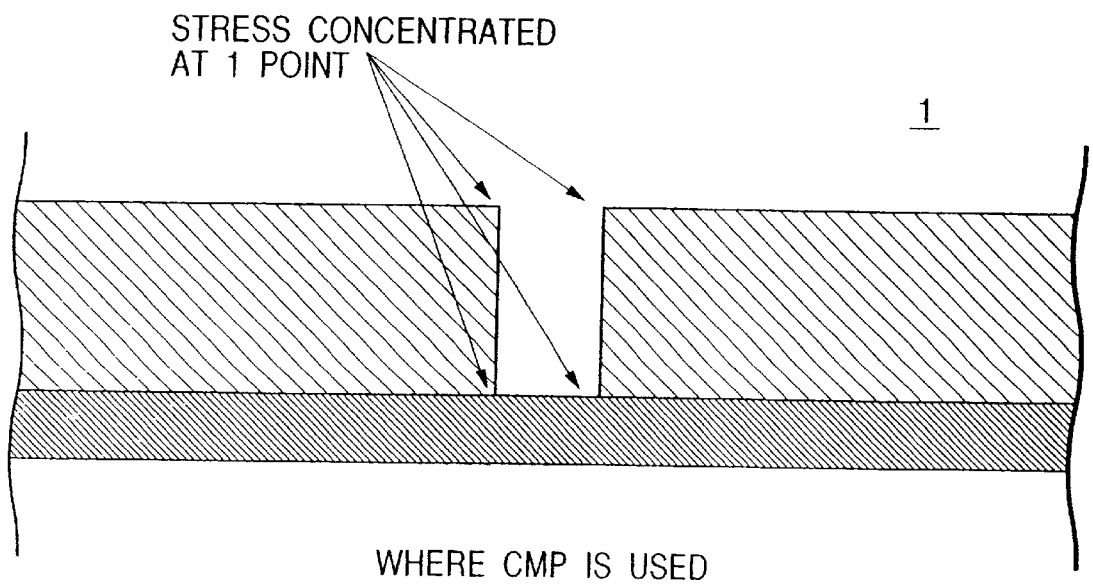
Figure 5:
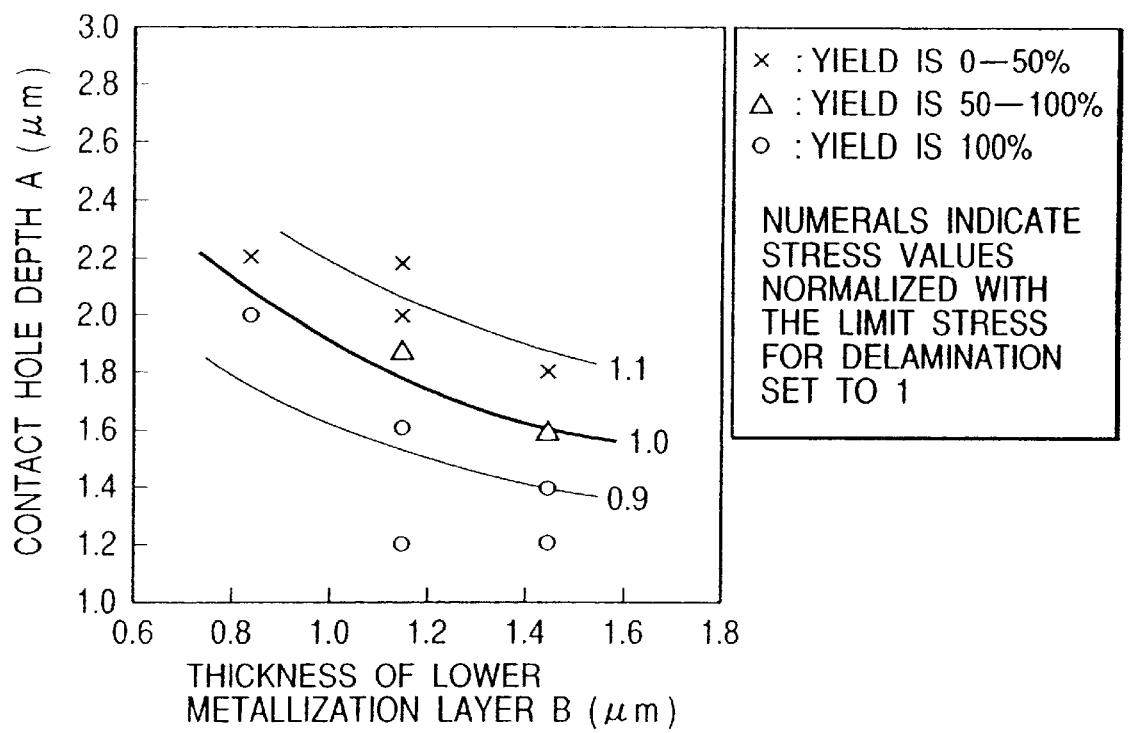
FIG. 5 is a graph illustrating the relation among dimensional parameters, stress, and the frequency of occurrence of defects.
Figure 6:
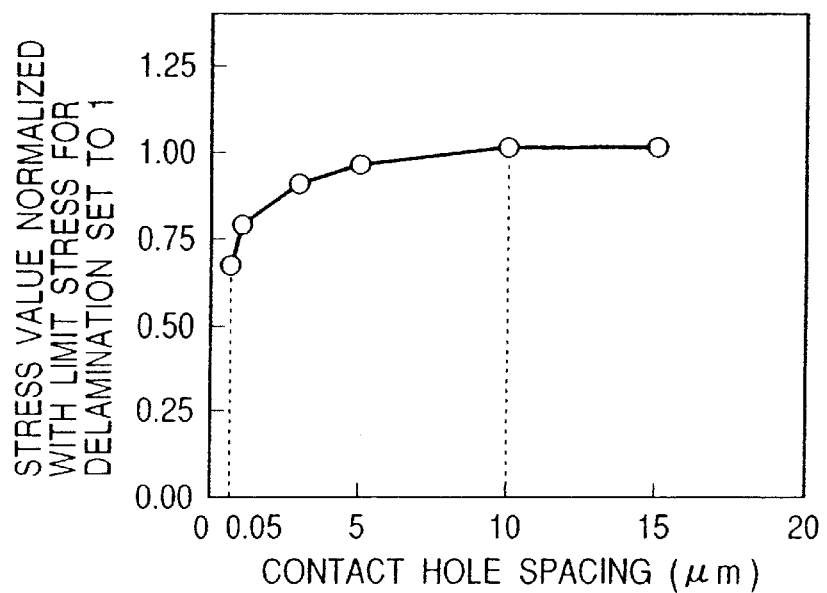
FIG. 6 is a graph illustrating the relation between contact hole spacing and normalized stress.
Figure 7:
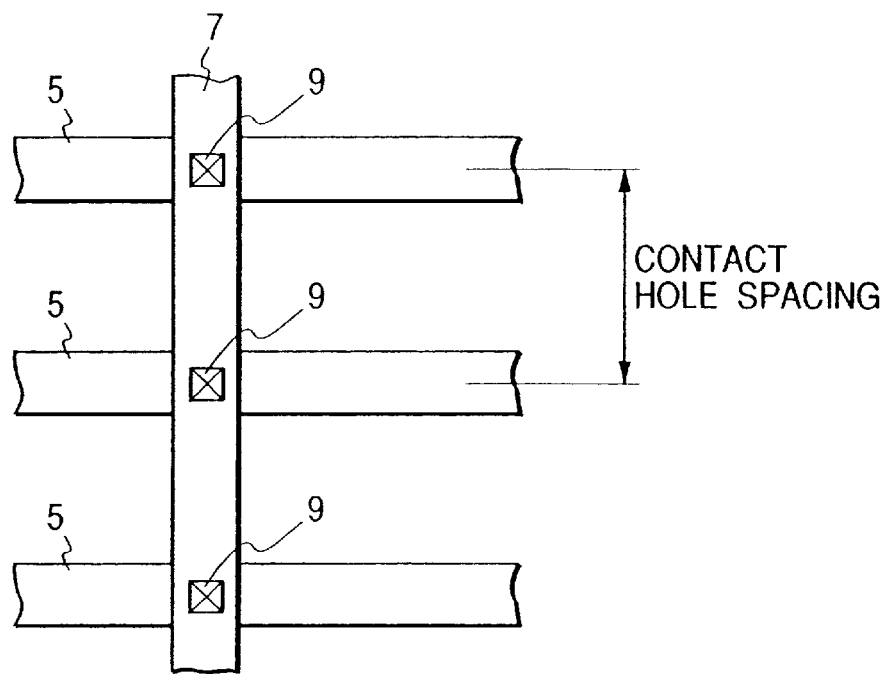
FIG. 7 is a fragmentary view illustrating the relation between one conductive interconnect arrangement and contact hole spacing.
Figure 8:
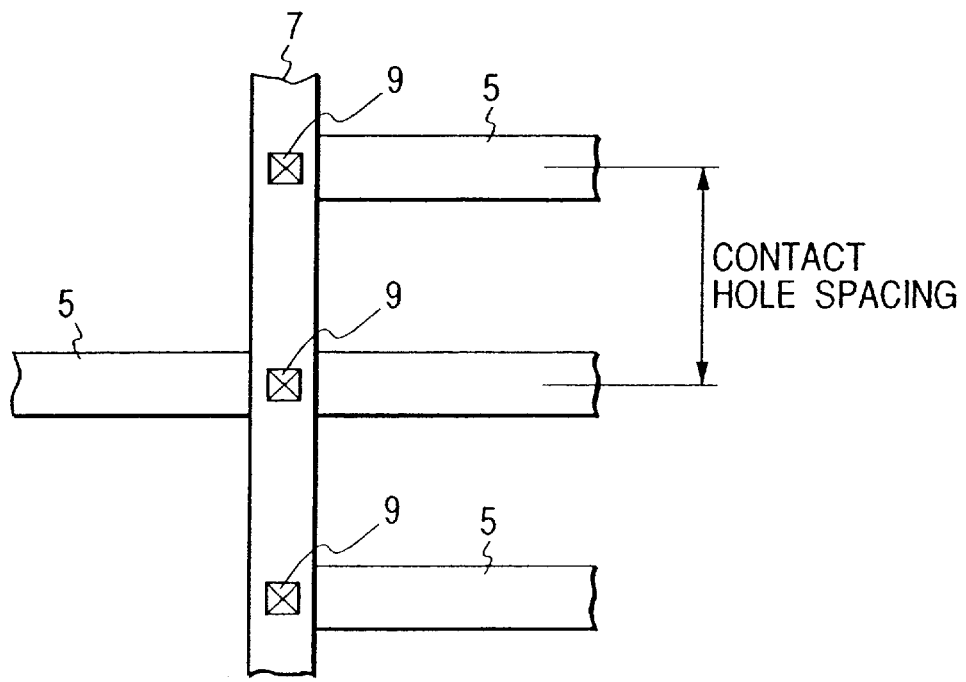
FIG. 8 is a fragmentary view illustrating the relation between another conductive interconnect arrangement and contact hole spacing.

If planarization is simply performed by conventional CMP, stress tends to be concentrated in the corners as shown in FIG. 4a. This tends to induce delamination of the film. Hence, the production yield tends to deteriorate. In the present embodiment, however, the stress can be suppressed below the limit strength of the film for delamination and so no delamination takes place. Thus, a reliable semiconductor device 1 can be manufactured with a high yield.

In the known technique, if deep contact holes 8 for connecting the metallization layer 16 in the memory 13 with the lower metallization layer 5 in the logic circuit are formed, delamination of the buried electrodes 9 occurs with a certain probability.

In the present embodiment, the buried electrodes 9 connecting the metallization layer 16 in the memory 13 and the lower metallization layer 5 in the logic circuit satisfy the relations given by Eq. (1) above. Therefore, the stress in the buried electrodes 9 at the bottoms of the contact holes 8 does not exceed the limit stress for delamination. In consequence, the buried electrodes 9 do not peel. As a result, reliable electrical connections can be made. That is, a reliable semiconductor device 1 can be fabricated.

In the present embodiment, the high-density memory 13 and the high-density logic circuit 14 are contained within the semiconductor device 1 in the form of one chip. The present embodiment may also be used advantageously where devices of different heights are connected. In this embodiment, the lower metallization layer is made of a material including aluminum, and the buried electrodes 9 are made of a material including tungsten. Where other material is employed, the semiconductor device may be fabricated by referring to mathematical equations concerning the material.

Figure 11:
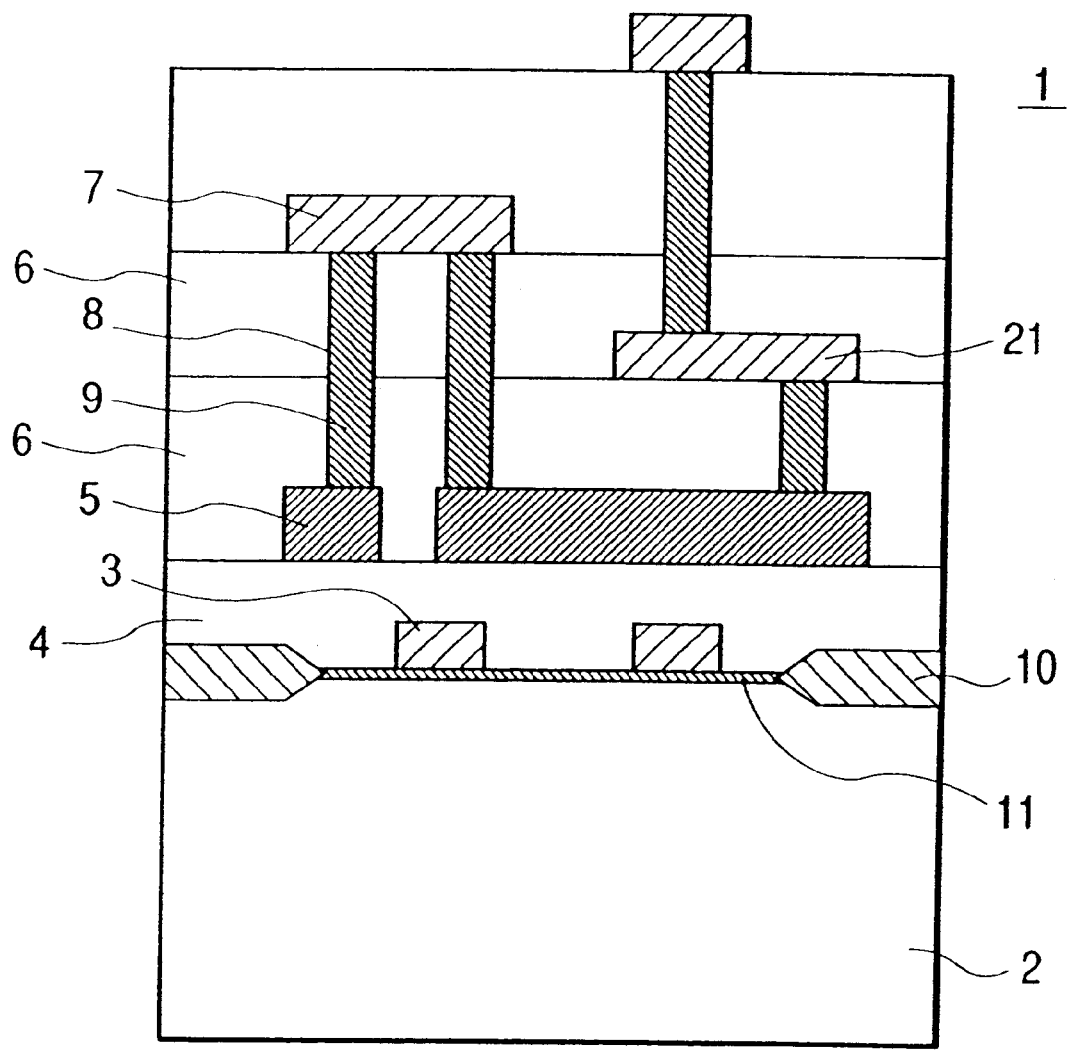
FIG. 11 is a schematic cross-sectional view of a further semiconductor device in accordance with the invention.

Referring next to FIG. 11, there is shown a third embodiment of the present invention. In this embodiment, the thicknesses of various metallization layers are varied according to the contact hole density. In FIG. 11, the density of the contact holes 8 connected to the lower metallization layer 5 is high. The lower metallization layer can be made thicker accordingly. However, the density of the, contact holes 8 connected to an intermediate metallization layer 21 is small. Therefore, it is necessary to make the intermediate metallization layer 21 thinner, than the lower metallization layer. In the present invention, the stress in the contact holes in the layers can be suppressed below the limit strength of the film for delamination. Therefore, no delamination occurs. The manufacturing yield does not deteriorate. Thus, a reliable semiconductor device 1 can be obtained.

Figure 12:
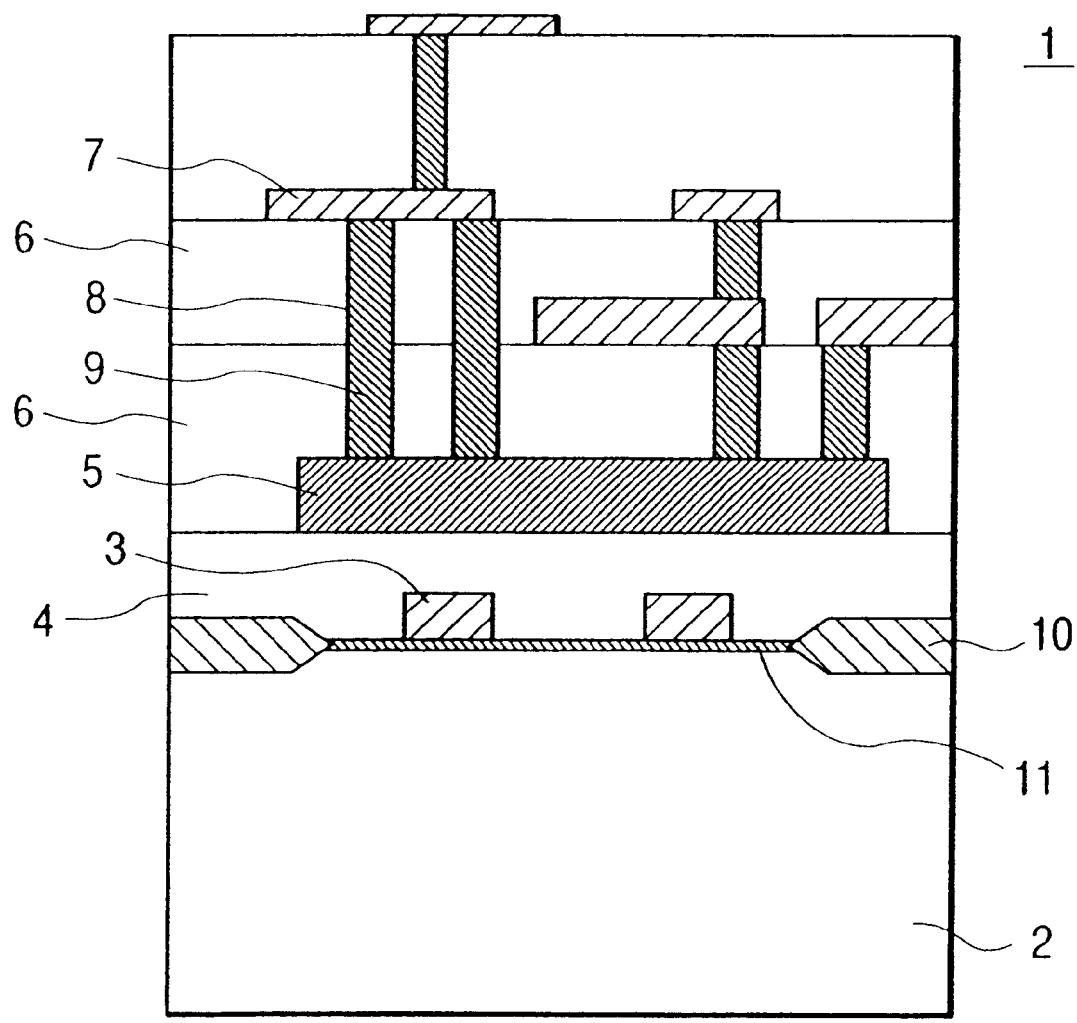
FIG. 12 is a schematic cross-sectional view of a still other semiconductor device in accordance with the invention.

Referring next to FIG. 12, there is shown a fourth embodiment of the present invention. The present embodiment is characterized in that the metallization layer at the higher level is made thinner. The thickness of a metallization layer is the thickness of the portion made of a conductive material. Where the metallization layer is a multilayer film, the thickness is the total of the thicknesses of the individual layers.

In the semiconductor device 1 in accordance with the present embodiment, a metallization layer at a lower level needs more contact holes to permit connection with an upper metallization layer. Therefore, the density of contact holes on the average increases downwardly. By making a metallization layer at a higher level thinner, delamination of the film inside the contact holes 8 is prevented. In the present embodiment, the stress in the contact holes 8 in each layer can be suppressed below the limit strength for delamination. Therefore, no delamination takes place. The production yield does not deteriorate. Therefore, a reliable semiconductor device 1 can be derived.

In the present embodiment, the contact hole depth and the thickness of the lower metallization layer are optimized. If the contact holes are deep, the stress in the buried electrodes 9 is reduced. Thus, delamination of the film is prevented. Consequently, a semiconductor device operating at a high speed or having many functions can be provided.

What is claimed:

1. A method of fabricating a semiconductor device, comprising the steps of:

forming circuitry on a main surface of a semiconductor substrate;

then forming a first dielectric film on the main surface of said semiconductor substrate;

then planarizing a top surface of said first dielectric film more remote from said semiconductor substrate;

then forming a first metallization layer in desired positions to a thickness of B on said planarized first dielectric film to form conductive interconnects having a minimum linewidth R;

then forming a second dielectric film on the planarized surface of said first dielectric film;

then planarizing a top surface of said second dielectric film more remote from said semiconductor substrate;

then forming contact holes in said second dielectric film such that said contact holes reach said first metallization layer and have a depth A satisfying relations given by

[Eq. 3]

$$(0.605/R)^{0.5} < A < 2.78 - 1.02B + 0.172B^2$$

then embedding a conductive material including tungsten atoms into said contact holes; and then forming a second metallization layer in desired locations on the planarized surface of said second dielectric film.

2. A method of fabricating a semiconductor device, comprising the steps of:

forming circuitry on a main surface of a semiconductor substrate;

then forming a first dielectric film on the main surface of said semiconductor substrate;

then planarizing a top surface of said first dielectric film more remote from said semiconductor substrate;

forming a first metallization layer in desired locations to a thickness of B on said planarized surface of said first, dielectric film to form conductive interconnects having a minimum linewidth R;

then forming a second dielectric film on the planarized surface of said first dielectric film;

then planarizing a top surface of said second dielectric film more remote from said semiconductor substrate;

then forming contact holes in said second dielectric film such that said contact holes reach said first metallization layer and have a depth A satisfying relations given by

[Eq. 4]

$$(0.605/R)^{0.52}1 A < 3.84 - 2.14B + 0.25B^2$$

then embedding a conductive material including aluminum atoms into said contact holes; and then forming a second metallization layer in desired locations on the planarized surface of said second dielectric film.

3. The method of claim 1 or 2, wherein said step of planarizing the top surface of said second dielectric, film is performed by CMP.

* * * * *